United States Patent
Sundaram

(10) Patent No.: US 10,676,826 B2
(45) Date of Patent: Jun. 9, 2020

(54) LASER-ASSISTED ATOMIC LAYER DEPOSITION OF 2D METAL CHALCOGENIDE FILMS

(71) Applicant: Veeco Instruments Inc., Plainview, NY (US)

(72) Inventor: Ganesh Sundaram, Concord, MA (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 15/940,533

(22) Filed: Mar. 29, 2018

(65) Prior Publication Data

US 2018/0216232 A1 Aug. 2, 2018

Related U.S. Application Data

(62) Division of application No. 15/257,493, filed on Sep. 6, 2016, now abandoned.

(60) Provisional application No. 62/218,734, filed on Sep. 15, 2015.

(51) Int. Cl.

| C23C 16/30 | (2006.01) |
| C23C 16/40 | (2006.01) |
| C23C 16/455 | (2006.01) |
| C23C 16/56 | (2006.01) |
| H01J 37/32 | (2006.01) |

(52) U.S. Cl.
CPC ............ C23C 16/56 (2013.01); C23C 16/305 (2013.01); C23C 16/405 (2013.01); C23C 16/45542 (2013.01); C23C 16/45544 (2013.01); H01J 37/32357 (2013.01); H01J 37/32458 (2013.01); H01J 37/32724 (2013.01)

(58) Field of Classification Search
CPC ............ C23C 16/56; C23C 16/45544; C23C 16/45542; C23C 16/305; C23C 16/405; H01J 37/32724; H01J 37/32458; H01J 37/32357
See application file for complete search history.

(56) References Cited

U.S. PATENT DOCUMENTS

| 2004/0097103 A1* | 5/2004 | Imai ................... B23K 26/0604 438/795 |
| 2011/0204475 A1* | 8/2011 | Rui ....................... C01G 23/047 257/532 |
| 2015/0118487 A1* | 4/2015 | Wolden .................. C01G 49/12 428/336 |
| 2016/0047059 A1* | 2/2016 | Kim .................. H01L 21/02381 438/199 |
| 2016/0372365 A1* | 12/2016 | Tang ....................... H01L 29/78 |

FOREIGN PATENT DOCUMENTS

WO 2015002782 A1 1/2015

OTHER PUBLICATIONS

Song et al. "Layer-Controlled, Wafer-Scale, and Conformal Synthesis of Tungsten Disulfide Nanosheets Using Atomic Layer Deposition" (2013) ACSNano. vol. 7 No. 12. pp. 11333-11340 (Year: 2013).*

* cited by examiner

Primary Examiner — Jose Hernandez-Kenney
(74) Attorney, Agent, or Firm — Downs Rachlin Martin PLLC

(57) ABSTRACT

Methods of forming 2D metal chalcogenide films using laser-assisted atomic layer deposition are disclosed. A direct-growth method includes: adhering a layer of metal-bearing molecules to the surface of a heated substrate; then reacting the layer of metal-bearing molecules with a chalcogenide-bearing radicalized precursor gas delivered using a plasma to form an amorphous 2D film of the metal chalcogenide; then laser annealing the amorphous 2D film to form a crystalline 2D film of the metal chalcogenide, which can have the form MX or $MX_2$, where M is a metal and X is the chalcogenide. An indirect growth method that includes forming an $MO_3$ film is also disclosed.

17 Claims, 5 Drawing Sheets

LASER-ASSISTED ATOMIC LAYER DEPOSITION OF 2D METAL CHALCOGENIDE FILMS

CROSS-REFERENCE TO RELATED APPLICATIONS

This application is a divisional application of U.S. patent application Ser. No. 15/257,493, filed on Sep. 6, 2016, entitled "Laser-Assisted Atomic Layer Deposition of 2D Metal Chalcogenide Films," now abandoned, which application claims the benefit of priority of under 35 USC 119(e) of U.S. Provisional Patent Application Ser. No. 62/218,734, filed on Sep. 15, 2015, each of which is incorporated by reference herein in its entirety.

FIELD

The present disclosure relates to atomic layer deposition, and in particular relates to laser-assisted atomic layer deposition of two-dimensional (2D) metal chalcogenide layer.

The entire disclosure of any publication or patent document mentioned herein is incorporated by reference.

BACKGROUND

Two dimensional (2D) materials are being actively pursued as possible successor materials to silicon. Two such 2D materials are graphene and metal chalcogenides, which have the form MX ("metal monochalcogenides") or $MX_2$ ("metal dichalcogenides"), where M is a metal atom, and X is a chalcogenide that can be either S, Se, or Te.

Currently, 2D materials are formed using a variety of techniques. These techniques fall into two major categories, namely top-down methods and bottom-up methods. Top-down methods rely on exfoliation of bulk (three-dimensional-3D) forms of the materials in question (for example $MoS_2$, or $WS_2$, etc. . . . ) into their 2D form. For $MoS_2$, such a method strips off thin layers of 2D $MoS_2$ from the bulk 3D $MoS_2$. The stripping process can be done via purely physical means, such as using cellophane tape to exfoliate the surface of the 3D material. The exfoliation can also be done electrochemically. In either case, the exfoliation technique yields extremely small amounts of the 2D materials at a time, e.g., on the order of square microns.

The bottom-up techniques seek to remedy the issue of only being able to generate small amounts of the desired 2D material, by initially growing a thin layer of the oxide of the metal, and subsequently processing it to arrive at a large-area layer of the 2D material. The most common film growth technique used for the bottom-up process has been chemical vapor deposition (CVD). While this technique can produce large areas of metal chalcogenides, the process is difficult to control to obtain monolayer growth of 2D material. In addition, the quality of material can vary greatly from run to run, which make subsequent use of the material as a substitute for silicon highly problematic.

SUMMARY

Methods of forming 2D metal chalcogenide films using laser-assisted atomic layer deposition are disclosed. A direct-growth method includes: adhering a layer of metal-bearing molecules to the surface of a heated substrate; then reacting the layer of metal-bearing molecules with a chalcogenide-bearing radicalized precursor gas delivered using a plasma to form an amorphous 2D film of the metal chalcogenide; then laser annealing the amorphous 2D film to form a crystalline 2D film of the metal chalcogenide, which can have the form MX or $MX_2$, where M is a metal and X is the chalcogenide. An indirect growth method that includes forming an $MO_3$ film is also disclosed.

An aspect of the disclosure is a method of forming a substantially two-dimensional (2D) film of a metal chalcogenide on a surface of a substrate. The method includes a) adhering a layer of metal-bearing molecules to the surface of a heated substrate using an atomic layer deposition (ALD) process. The method also includes b) reacting the layer of metal-bearing molecules with a chalcogenide-bearing radicalized precursor gas delivered using a plasma to form an amorphous and substantially 2D film of the metal chalcogenide. The method also includes c) laser annealing the amorphous and substantially 2D film to form therefrom a substantially crystalline and substantially 2D film of the metal chalcogenide. The metal chalcogenide can have the form MX or $MX_2$. M is a metal and X is a chalcogenide.

Another aspect of the disclosure is the method described above, wherein the metal M is one of Mo and W and wherein the chalcogenide X is one of S, Se and Te.

Another aspect of the disclosure is the method described above, wherein the plasma includes X-bearing radicals.

Another aspect of the disclosure is the method described above, wherein the X-bearing radicals include $H_2S^*$.

Another aspect of the disclosure is the method described above, the method further includes processing the substrate to remove the substantially crystalline and substantially 2D film from the surface of the substrate.

Another aspect of the disclosure is the method described above, wherein the substantially crystalline and substantially 2D film of the metal chalcogenide has dimensions of 25 mm×25 mm or greater.

Another aspect of the disclosure is the method described above, wherein acts a) and b) are repeated multiple times before performing act c).

Another aspect of the disclosure is a method of forming a substantially two-dimensional (2D) film of a metal chalcogenide on a surface of a substrate. The method includes a) adhering a layer of metal-bearing molecules to the surface of a heated substrate using an atomic layer deposition (ALD) process. The method also includes b) causing an oxidant precursor gas to react with the layer of metal-bearing molecules to form a layer of $MO_3$. The method also includes c) repeating acts a) and b) to form an $MO_3$ film having multiple layers of $MO_3$. The method also includes d) causing a chalcogenide-bearing radicalized precursor gas to react with the $MO_3$ film to form an amorphous and substantially 2D film of the metal chalcogenide. The method also includes e) laser annealing the amorphous and substantially 2D film to form therefrom a substantially crystalline and substantially 2D film of the metal chalcogenide. The metal chalcogenide can have the form MX or $MX_2$. M is a metal and X is a chalcogenide.

Another aspect of the disclosure is the method described above, wherein the metal M is one of Mo and W and wherein the chalcogenide X is one of S, Se and Te.

Another aspect of the disclosure is the method described above, wherein act d) includes providing the chalcogenide-bearing radicalized precursor gas using a plasma.

Another aspect of the disclosure is the method described above, wherein the chalcogenide-bearing radicalized precursor gas comprises $H_2S^*$.

Another aspect of the disclosure is the method described above, the method further includes processing the substrate to remove the substantially crystalline and substantially 2D film from the surface of the substrate.

Another aspect of the disclosure is the method described above, wherein the substantially crystalline and substantially 2D film of the metal chalcogenide has dimensions of 25 mm×25 mm or greater.

Another aspect of the disclosure is a method of forming a substantially two-dimensional (2D) film of a metal chalcogenide on a surface of a substrate. The method includes a) adhering a layer of metal-bearing molecules to the surface of a heated substrate using an atomic layer deposition (ALD) process. The method also includes b) causing an oxidant precursor gas to react with the layer of metal-bearing molecules to form a layer of $MO_3$. The method also includes c) repeating acts a) and b) to form an $MO_3$ film having multiple layers of $MO_3$. The method also includes d) laser annealing the $MO_3$ film to form therefrom an $MO_2$ film. The method also includes e) causing a chalcogenide-bearing radicalized precursor gas to react with the $MO_2$ film to form an amorphous and substantially 2D film of the metal chalcogenide. The method also includes f) laser annealing the amorphous and substantially 2D film to form therefrom a substantially crystalline and substantially 2D film of the metal chalcogenide. The metal chalcogenide can have the form MX or $MX_2$. M is a metal and X is a chalcogenide.

Another aspect of the disclosure is the method described above, wherein the metal M is one of Mo and W and wherein the chalcogenide X is one of S, Se and Te.

Another aspect of the disclosure is the method described above, wherein act e) includes providing the chalcogenide-bearing radicalized precursor gas using a plasma.

Another aspect of the disclosure is the method described above, wherein the chalcogenide-bearing radicalized precursor gas comprises $H_2S^*$.

Another aspect of the disclosure is the method described above, the method further includes processing the substrate to remove the substantially crystalline and substantially 2D film from the surface of the substrate.

Another aspect of the disclosure is the method described above, wherein the substantially crystalline and substantially 2D film of the metal chalcogenide has dimensions of 25 mm×25 mm or greater.

Another aspect of the disclosure is a method of forming a substantially two-dimensional (2D) film of a metal monochalcogenide (MX) or a metal dichalcogenide ($MX_2$) on a surface of a substrate using an atomic layer deposition process. The method includes a) providing the substrate in a chamber interior having a pressure in the range from 0.1 Torr to 0.5 Torr and heating the substrate to a temperature of between 150° C. and 500° C. The method also includes b) introducing a metal-bearing precursor gas having a metal M to the chamber interior. The metal-bearing precursor gas reacts with and remains on the substrate. The method also includes c) purging the chamber interior of excess metal-bearing precursor gas. The method also includes d) introducing a chalcogenide precursor gas into the chamber interior using a plasma. The chalcogenide precursor gas reacts with the metal-bearing precursor gas that remains on the substrate, to produce an amorphous film of MX or $MX_2$. The method also includes e) purging the chamber interior. The method also includes f) scanning a laser beam over the amorphous film to heat the amorphous film to a temperature of between 650° C. and 1200° C. to produce the substantially 2D film of either MX or $MX_2$ on the surface of the substrate. The substantially 2D film is substantially crystalline.

Another aspect of the disclosure is the method described above, wherein the metal M is one of Mo and W.

Another aspect of the disclosure is the method described above, wherein the chalcogenide X is one of S, Se and Te.

Another aspect of the disclosure is the method described above, wherein the plasma includes X-bearing radicals.

Another aspect of the disclosure is the method described above, wherein the X-bearing radicals include $H_2S^*$.

Another aspect of the disclosure is the method described above, the method further includes processing the substrate to remove the substantially crystalline and substantially 2D film from the surface of the substrate.

Another aspect of the disclosure is the method described above, wherein the laser beam has a nominal wavelength of 532 nm.

Another aspect of the disclosure is the method described above, wherein in act d), the providing of the chalcogenide precursor gas is performed in a continuous manner or a pulsed manner.

Another aspect of the disclosure is the method described above, wherein the 2D film has dimensions of 25 mm×25 mm or greater.

Another aspect of the disclosure is the method described above, wherein in act f), the laser scanning is performed in a raster scan.

Another aspect of the disclosure is the method described above, wherein the substrate is made of silicon or sapphire.

Another aspect of the disclosure is the method described above, wherein acts b) through e) are repeated multiple times before performing act f).

Another aspect of the disclosure is a method of forming a two-dimensional (2D) film of either a metal monochalcogenide (MX) or a metal dichalcogenide ($MX_2$) on a surface of a substrate using an atomic layer deposition process. The method includes a) providing the substrate in a chamber interior having a pressure in the range from 0.1 Torr to 0.5 Torr and heating the substrate to an initial temperature of between 150° C. and 500° C. The method also includes b) providing a metal-bearing precursor gas having a metal M to the chamber interior, including purging any excess metal-bearing precursor gas. The metal M is one of Mo and W. The method also includes c) providing an oxidant precursor gas into the chamber interior to form a layer of $MO_3$, and purging any excess oxidant gas. The method also includes d) repeating acts b) and c) to form an $MO_3$ film having multiple layers of $MO_3$. The method also includes e) introducing a chalcogenide precursor gas into the chamber interior using a plasma. The chalcogenide precursor gas reacts with the $MO_3$ film to produce a film of amorphous MX or $MX_2$, and purging the chamber interior. The method also includes f) scanning a laser beam over the amorphous film of MX or $MX_2$ to heat the amorphous film of MX or $MX_2$ to a temperature of between 650° C. and 1200° C. to produce a substantially crystalline film of either MX or $MX_2$.

Another aspect of the disclosure is the method described above, wherein the oxidant precursor gas is one of $H_2O$, $O_3$, $O^*$ and $O_2$.

Another aspect of the disclosure is the method described above, wherein the chalcogenide precursor gas includes sulfur.

Another aspect of the disclosure is the method described above, wherein the metal-bearing precursor gas is selected from the group of precursor gases consisting of Bis(tert-butylimido)bis(dimethylamido)Molybdenum, $MoCl_5$, Molybdenum hexacarbonyl, bis(tert-butylimido)bis(dimethylamido)Tungsten, $WH_2(iPrCp)_2$ and $WF_6$.

Another aspect of the disclosure is the method described above, wherein the laser beam has a nominal wavelength of 532 nm.

Another aspect of the disclosure is the method described above, wherein in act e), the providing of the chalcogenide precursor gas is performed in either a continuous manner or a pulsed manner.

Another aspect of the disclosure is the method described above, the method further includes removing the substantially crystalline film of either MX or $MX_2$ from the surface of the substrate.

Another aspect of the disclosure is the method described above, wherein the laser scanning is performed in a raster scan.

Another aspect of the disclosure is the method described above, wherein the substrate is made of silicon or sapphire.

Another aspect of the disclosure is the method described above, wherein the substrate is supported by a heated chuck, and in act a), the substrate is heated to the initial temperature by the heated chuck.

Another aspect of the disclosure is the method described above, wherein the $MO_3$ film has between 3 and 8 layers of $MO_3$.

Another aspect of the disclosure is a method of forming a two-dimensional (2D) film of either a metal monochalcogenide (MX) or a metal dichalcogenide ($MX_2$) on a surface of a substrate using an atomic layer deposition process. The method includes a) providing the substrate in a chamber interior having a pressure in the range from 0.1 Torr to 0.5 Torr and heating the substrate to an initial temperature of between 150° C. and 500° C. The method also includes b) providing a metal-bearing precursor gas having a metal M to the chamber interior, including purging any excess metal-bearing precursor gas, wherein the metal M is one of Mo and W. The method also includes c) providing an oxidant precursor gas into the chamber interior to form a layer of $MO_3$, and purging any excess oxidant gas. The method also includes d) repeating acts b) and c) to form an $MO_3$ film having multiple layers of $MO_3$. The method also includes e) laser annealing the $MO_3$ film to form an $MO_2$ film. The method also includes f) introducing a chalcogenide precursor gas into the chamber interior using a plasma. The chalcogenide precursor gas reacts with the $MO_2$ film to produce a film of amorphous MX or $MX_2$, and purging the chamber interior. The method also includes g) scanning a laser beam over the amorphous film of MX or $MX_2$ to heat the amorphous film of MX or $MX_2$ to a temperature of between 650° C. and 1200° C. to produce a substantially crystalline film of either MX or $MX_2$.

Another aspect of the disclosure is the method described above, wherein the oxidant precursor gas is one of $H_2O$, $O_3$, O* and $O_2$.

Another aspect of the disclosure is the method described above, wherein the chalcogenide precursor gas includes sulfur.

Another aspect of the disclosure is the method described above, wherein the metal-bearing precursor gas is selected from the group of precursor gases consisting of Bis(tert-butylimido)bis(dimethylamido)Molybdenum, $MoCl_5$, Molybdenum hexacarbonyl, bis(tert-butylimido)bis(dimethylamido)Tungsten, $WH_2(iPrCp)_2$ and $WF_6$.

Another aspect of the disclosure is the method described above, wherein the laser beam has a nominal wavelength of 532 nm.

Another aspect of the disclosure is the method described above, wherein in act e), the providing of the chalcogenide precursor gas is performed in either a continuous manner or a pulsed manner.

Another aspect of the disclosure is the method described above, the method further includes removing the substantially crystalline film of either MX or $MX_2$ from the surface of the substrate.

Another aspect of the disclosure is the method described above, wherein the laser scanning is performed in a raster scan.

Another aspect of the disclosure is the method described above, wherein the substrate is made of silicon or sapphire.

Another aspect of the disclosure is the method described above, wherein the substrate is supported by a heated chuck, and in act a), the substrate is heated to the initial temperature by the heated chuck.

Another aspect of the disclosure is the method described above, wherein the $MO_3$ film has between 3 and 8 layers of $MO_3$.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this detailed description.

Cartesian coordinates are shown in some of the Figures for the sake of reference and are not intended to be limiting as to direction or orientation.

The terms "method" and "process" are used interchangeably herein.

Any limits or ranges set forth herein include the upper and lower values unless otherwise noted.

The term "substantially 2D" as used in connection with the films formed herein means that the film has one or a few layers, e.g., between 1 and 5 layers or between 1 and 3 layers.

The term "substantially crystalline" as used in connection with the films formed herein means that the films have a long-range order common in crystalline structures, wherein the molecules that make up the films generally have a regular and periodic orientation, as compared to an amorphous structure wherein the molecules are not regularly arranged.

Laser-Assisted ALD System

Figure 1:
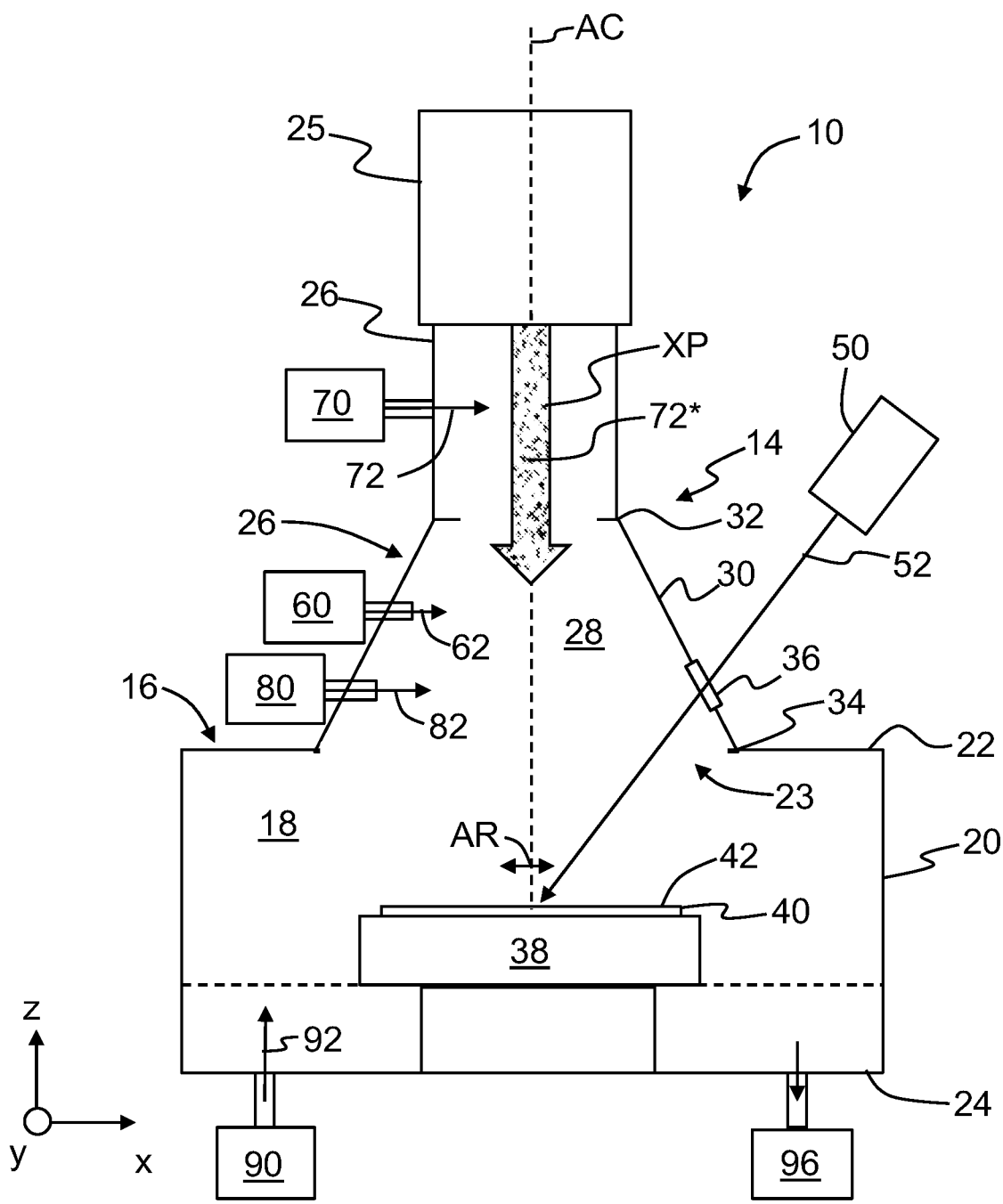
FIG. 1 is a schematic diagram of an example laser-assisted ALD system for carrying out the laser-assisted ALD-based methods disclosed herein.

FIG. 1 is a schematic diagram of an example laser-assisted ALD system ("system") 10 for carrying out the methods disclosed herein, which are described below. An example system 10 is one of the Fiji series modular, high-vacuum plasma-based ALD systems available from Cambridge Nanotech, Waltham, Mass.

The system 10 includes an ALD process chamber 14 that includes a central axis AC that runs in the z-direction and through the center of a main chamber 16. The main chamber 16 is defined by at least one sidewall 20, an upper wall 22 that includes an aperture 23, and a bottom wall 24. The main chamber 16 includes a main chamber interior ("interior") 18.

The system 10 also includes a plasma source 25 that is operably arranged relative to the main chamber 16 and is in communication with the interior 18 through a transition section 26 of ALD process chamber 14. The transition section 26 includes a transition section interior 28 and is defined by a conical wall 30 with a narrow open end 32 and a wide open end 34, wherein the narrow open end 32 is operably arranged closest to plasma source 25 and the wide open end 34 is operably arranged at the upper wall 22 at the aperture 23. In an example, the conical wall 30 supports a transparent window 36.

The system 10 also includes a chuck 38 operably disposed within the interior 18. The chuck 38 operably supports a substrate 40 that has an upper surface 42 on which the laser-assisted ALD methods are carried out. In an example, the substrate 40 is silicon, or sapphire. Other substrates can be used, and silicon or sapphire substrates 40 may be preferred only because they happen to be widely available and because semiconductor processing equipment and apparatus (e.g., the chuck 38) are typically designed to handle silicon or sapphire substrates 40. It is noted that the upper surface 42 of the substrate 40 typically includes Oft molecules when exposed to air, and that these molecules can play a role the ALD process as is known in the art and as described below.

The substrates 40 are used in the methods disclosed herein to form large-area 2D films of metal chalcogenides. In many of the prior art methods, the 2D materials are in the form of very small (e.g., few millimeter diameter) flakes. In an example, a large-area 2D film has dimensions of greater than 25 mm×25 mm or 50 mm×50 mm or 100 mm×100 mm. Note that a large-area film of 300 mm diameter can be divided up into a number of smaller but still large-area 2D films.

The system 10 also includes a laser source 50 operably arranged relative to the ALD process chamber 14 so that it can be selectively activated to generate a laser beam 52. The laser beam 52 passes through the transparent window 36 and into the interior 18 and then onto the upper surface 42 of the substrate 40 or more specifically onto the particular film formed thereon as described below. In an example, the chuck 38 can be configured to heat the substrate 40 to an initial temperature for processing. In an example, the laser source 50 is a YAG laser that emits the laser beam 52 having a wavelength of 532 nm. Other types of the laser sources 50 can be used wherein the laser beam 52 can heat the upper surface 42 of substrate 40 or the film formed thereon. In an example, the chuck 38 is movable in the x-y plane, as indicated by double-arrow AR, to effectuate the scanning of laser beam 52 over upper surface 42 of the substrate 40. In an example, the chuck 38 is also adjustable (e.g., movable) in the z-direction. Alternatively, the laser beam 52 can be scanned over the substrate 40 while the chuck 38 remains stationary, or the laser beam 52 can be expanded to cover a larger area of the upper surface 42 of substrate 40.

The system 10 also includes precursor gas sources 60, 70 and 80 that are respectively configured to provide (e.g., introduce) precursor gases 62, 72 and 82. In some of the methods below, only two precursor gases are used, while in some methods three precursor gases 62, 72 and 82 are used. In some examples, the precursor gas 62, 72 and 82 is delivered as part of a plasma XP using the plasma source 25.

In an example, the introduction of precursor gases 62, 72 and 82 can be managed via the operation of a controller (not shown) or can also be accomplished manually. In examples discussed below, the plasma source 25 is used to form a plasma XP from the precursor gas 72, as discussed below. The plasma XP includes a radicalized precursor gas 72*. In an example, the radicalized precursor gas 72* contains a chalcogenide X (chalcogenide precursor gas) and so that the plasma XP can be referred to as an X-bearing or chalcogenide-bearing plasma and the radicalized precursor gas 72* can be referred to as X-bearing gas or chalcogenide-bearing gas. The plasma XP is provided from the plasma source 25 to the interior 18 through the transition section interior 28 of the transition section 26.

The system 10 also includes an inert gas source 90 that provides an inert gas 92 to the interior 18. In an example, the inert gas 92 is $N_2$, Ar or $H_2$. The inert gas source 90 can be used to purge the interior 18 by using the inert gas 92 ($N_2$, and Ar) as a purge gas. An $H_2$ gas can be used to create a reducing environment, under which reduction of the metal chalcogenide as grown films can be effected.

The system 10 also includes a vacuum system 96 that is used to evacuate the interior 18 to initiate the ALD-based methods as well as to assist in removing excess precursor gases 62, 72 and 82 during the various steps (including purge steps) of the laser-assisted ALD methods disclosed herein. In examples of the methods discussed herein, the purge step includes flushing the interior 18 with the inert gas 92 and then removing the inert gas 92, any remaining precursor gas 62, 72 and 82 and the reaction byproducts using the vacuum system 96. It is noted here that the ALD-based reactions discussed herein are self-limiting so that there will typically be leftover precursor gases 62, 72 and 82 that do not react and that need to be removed from the interior 18 prior to introducing the next precursor gas 62, 72 and 82.

Two-Chamber Systems and Methods

Figure 2:
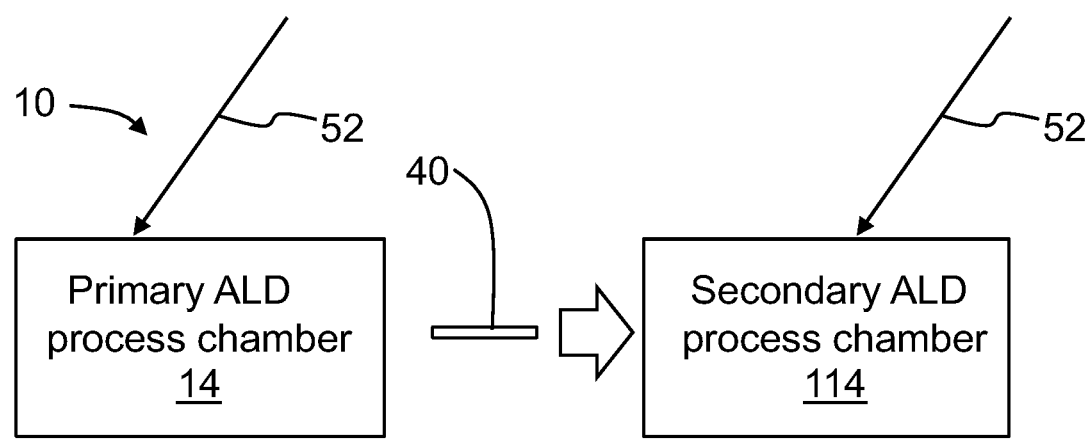
FIG. 2 is a schematic diagram of an example ALD system that includes two process chambers.

In an example, the methods described herein can be carried out in a single ALD process chamber 14. In an example system 10 shown in FIG. 2, the system 10 includes the ALD process chamber 14 as a primary chamber along with a secondary ALD process chamber 114, and the methods disclosed herein are carried out using more than one process chamber. The configuration of system 10 of FIG. 2 allows for the initial steps in the process to be carried out in the primary ALD process chamber 14, then the substrate 40 removed and placed in the secondary ALD process chamber 114 where the process continues to generate the final 2D layer, as described below. In an example, the secondary ALD process chamber 114 is also configured for performing laser processing using a second laser beam 52.

Direct Growth Method

A first method, referred to as a "direct growth" method, is now described with respect to forming a substantially 2D layer of a metal dichalcogenide in the form of $MoS_2$ by way of example. As noted below, the same method steps are used to form a metal monochalcogenide MX, such as MoSe, MoTe, WTe, etc. Whether a metal monochalcogenide or a metal dichalcogenide is formed depends on the valence of the particular metal M and the particular chalcogenide X employed.

With reference again to FIG. 1, the substrate 40 is placed on the chuck 38 within the interior 18 and the vacuum system 96 is used to reduce the chamber pressure, e.g., to within a range from 0.1 to 0.5 Torr. The substrate 40 is then heated (e.g., via the chuck 38) to an initial process temperature, which in an example can be in the range from 150° C. to 500° C.

The ALD process is then started, and it includes a number of steps. The first step includes providing a first precursor gas 62 into the interior 18, wherein the first precursor gas 62 is a metal-bearing precursor gas, e.g., a molybdenum-bearing gas such as $MoCl_5$. In an example, the first precursor gas 62 includes the select metal M and chemical ligands. The first precursor gas 62 grafts itself onto the aforementioned $OH^-$ molecules (groups) on the upper surface 42 of the substrate 40. In an example, the first precursor gas 62 includes at least one of: Bis(tert-butylimido)bis(dimethylamido)Molybdenum, $MoCl_5$, Molybdenum hexacarbonyl, bis(tert-butylimido)bis(dimethylamido)Tungsten, $WH_2(iPrCp)_2$ and $WF_6$.

In a second step, excess of the first precursor gas 62 as well as volatile byproducts are purged, e.g., using the inert gas 92 and the vacuum system 96.

In a third step, a second precursor gas 72, which is a chalcogenide-bearing or "X-bearing" gas (e.g., a sulfur-bearing gas such as $H_2S$, dimethyl disulfide, di-tert-butyl disulfide, etc.), is provided in either pulsed or continuous manner. The pulsed method involves rapidly opening and closing a valve (not shown) on the second precursor gas source 70.

Figure 3A:
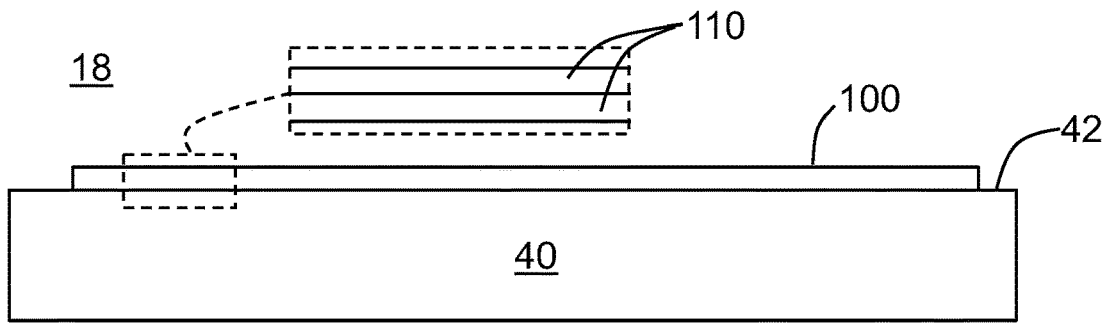
FIGS. 3A through 3C are cross-sectional views of the substrate and illustrate the example direct growth method of forming a substantially 2D MX or $MX_2$ film.

The second precursor gas 72 is provided to the transition section 26, which generates X-bearing plasma XP, which as discussed above includes radicalized X-bearing precursor gas 72*. In the discussion below, radicalized X-bearing precursor gas 72* is assumed to be a sulfur-bearing, e.g., includes hydrogen sulfide radicals, denoted as $H_2S^*$. The first precursor gas 62 that has grafted onto the upper surface 42 of the substrate 40 interacts with the particular chalcogenide X in the radicalized X-bearing precursor gas 72* to form an initial film 100 of at least one layer 110 of MX or $MX_2$, as shown in FIG. 3A. An example reaction is:

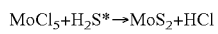

$MoCl_5+H_2S^* \rightarrow MoS_2+HCl$

The initial film 100 can be formed of a sub-monolayer, a monolayer, or multiple layers of layer 110. A sub-layer 110 is less than a complete layer, e.g., one or more islands. The layer 110 is amorphous. If the initial film 100 is defined by a sub-layer 110 or otherwise does not form a complete film (e.g., is made up of the aforementioned islands), then multiple cycles of the above-described first through third steps are used to achieve at least a monolayer 110 to form the initial film 100. In an example, the initial film 100 includes one or a few layers 110 of MX or $MX_2$, e.g., between 1 and 5 layers or between 1 and 3 layers.

In a fourth step, the excess $H_2S^*$ and volatile byproducts are purged.

Figure 3B:
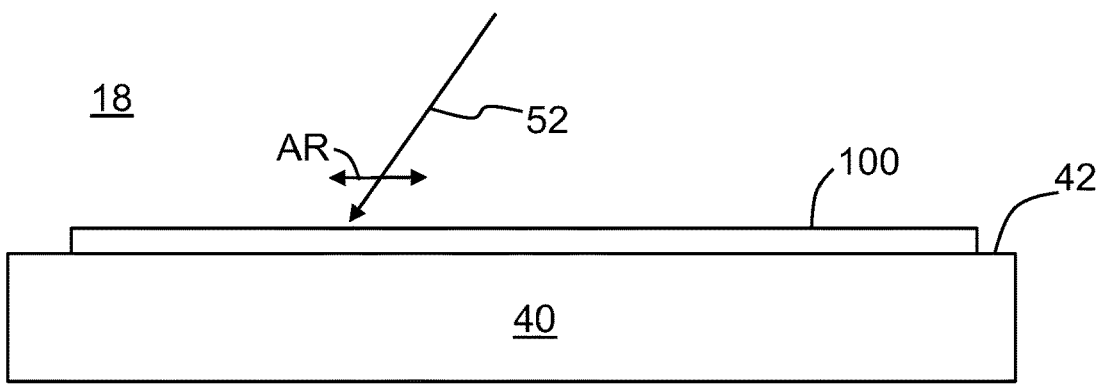
Figure 3C:
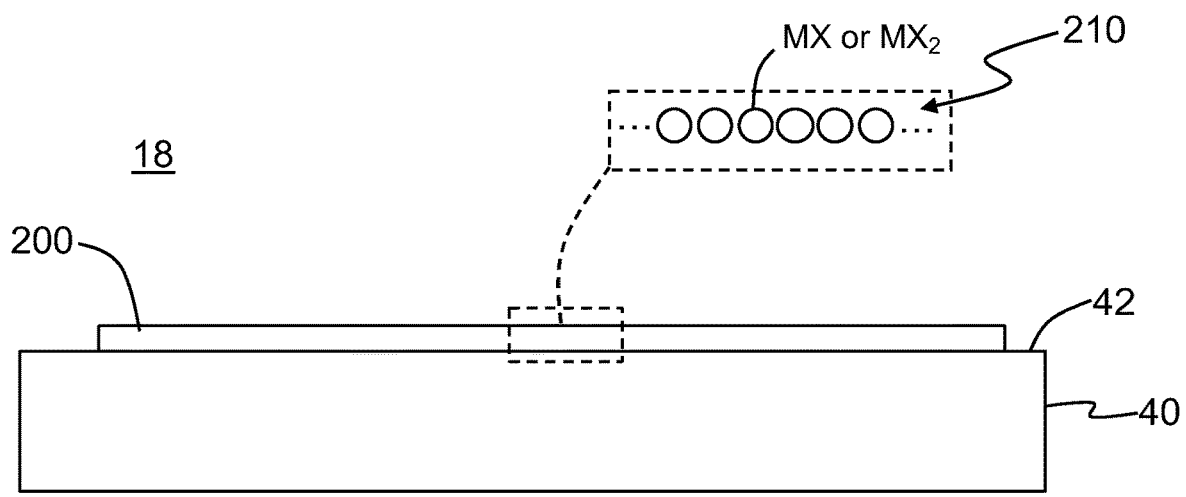

In a fifth step, which is illustrated FIG. 3B, the laser beam 52 is scanned (e.g., raster scanned) over the initial film 100 to bring the initial film 100 to a temperature in the range from 650° C. to 1200° C. This process can be referred to as laser annealing and causes the amorphous initial film 100 to become a substantially ordered or substantially crystalline film 200, which is made up one or a few layers 210 of MX or $MX_2$, as shown in FIG. 3C. In an example, the substantially crystalline film 200 consists of $MoS_2$. The substantially crystalline film 200 is substantially 2D or quasi-2D" meaning that it can comprise one or more layers 210, e.g., between 1 and 5 layers or between 1 and 3 layers.

Once the substantially crystalline film 200 of MX or $MX_2$ is formed, then the interior 18 is vented to the atmosphere using the inert gas 92, and the substrate 40 with the MX or $MX_2$ substantially crystalline film 200 formed thereon is removed from the main chamber 16.

The substrate 40 is then processed to separate the substantially crystalline film 200 from the upper surface 42 of the substrate 40. This can be done in any one of a number of known ways. For example, in one technique, the removal of the substantially crystalline film 200 from a sapphire substrate 40 is effected in the following manner: a) The substantially crystalline film 200 is spin coated with PMMA photoresist; b) the PMMA-coated substantially crystalline film 200 is then immersed into a solution of NaOH, which releases the PMMA-coated substantially crystalline film 200 from the substrate 40; c) the PMMA-coated substantially crystalline film 200 is then collected on an SiO/Si surface, and dried; d) the PMMA coating is then removed using an appropriate solvent such as acetone, and is then dried, leaving just the substantially crystalline film 200 residing on the SiO/Si surface.

Indirect Growth Method

A second method referred to herein as an "indirect growth" method is now described using M=Mo and X=S by way of example. As noted above, the same method steps are used to form a metal monochalcogenide MX, such as MoSe, MoTe, WTe, etc. Whether a metal monochalcogenide MX or a metal dichalcogenide $MX_2$ is formed depends on the valence of the metal M and the chalcogenide X.

In the second method, the substrate 40 is placed on the chuck 38 within the interior 18 and the vacuum system 96 is used to reduce the chamber pressure, e.g., to within a range from 0.1 to 0.5 Torr. The substrate 40 is then heated (e.g., via the chuck 38) to an initial process temperature, which in an example can be in the range from 150° C. to 500° C.

The ALD process is then started, and involves performing a number of steps, which includes some optional steps that are also described.

The first step includes providing a first precursor gas 62 into the interior 18, wherein the first precursor gas 62 is a metal-bearing precursor gas that includes metal M, such as molybdenum (e.g., $MoCl_5$). In an example, first precursor gas 62 includes at least one of: Bis(tert-butylimido)bis (dimethylamido)Molybdenum, $MoCl_5$, Molybdenum hexacarbonyl, bis(tert-butylimido)bis(dimethylamido)Tungsten, $WH_2(iPrCp)_2$ and $WF_6$. As with the direct growth method, the first precursor gas 62 attaches itself to the OH— groups on the upper surface 42 of substrate 40.

The second step involves purging the excess first precursor gas 62 from the interior 18.

Figure 4A:
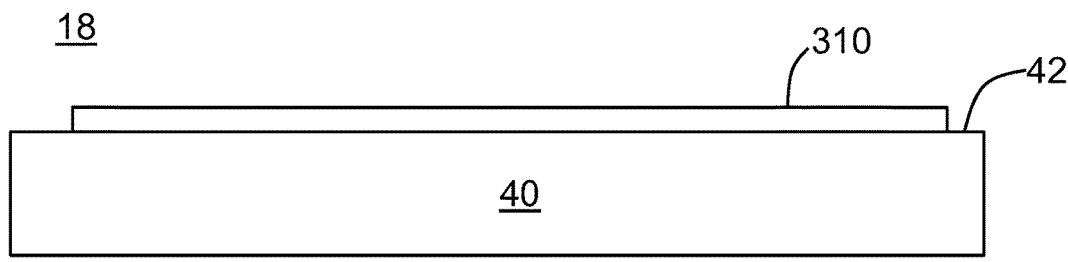
FIGS. 4A through 4F are cross-sectional views of the substrate and illustrate the example indirect growth method of forming a substantially 2D MX or $MX_2$ film.

The third step involves introducing a second precursor gas 82 in the form of an oxidizing precursor gas (e.g., $H_2O$, $O_3$, $O_2$, $O^*$, etc.) to react with the first precursor gas 62 bound to the upper surface 42 of the substrate 40 to produce a metal oxide ($MO_x$) layer 310 on the upper surface 42 of substrate 40, as shown in FIG. 4A. In an example, the second precursor gas 82 can be provided via the transition section 26. An example reaction is:

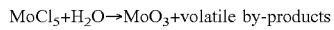

$MoCl_5 + H_2O \rightarrow MoO_3 +$ volatile by-products

Figure 4B:
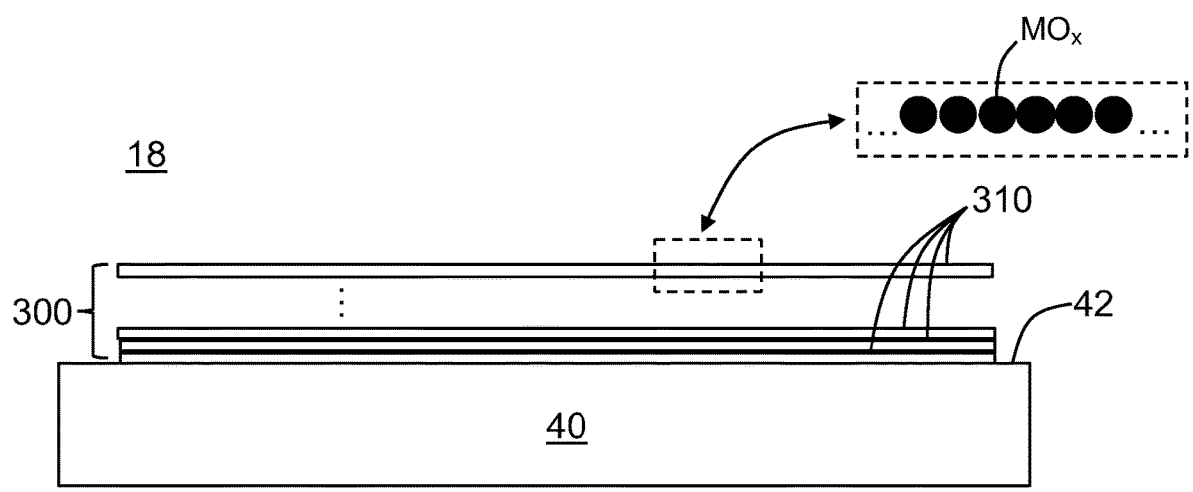

The fourth step includes repeating the first through third steps as needed to form one or more $MO_x$ layers 310 to form a $MO_x$ film 300 that in an example has between 3 and 8 $MO_x$ layers 310, as shown in FIG. 4B. One reason for forming $MO_x$ film 300 to have multiple $MO_x$ layers 310 is that some of the layers are consumed in the subsequent chemical reactions.

Figure 4C:
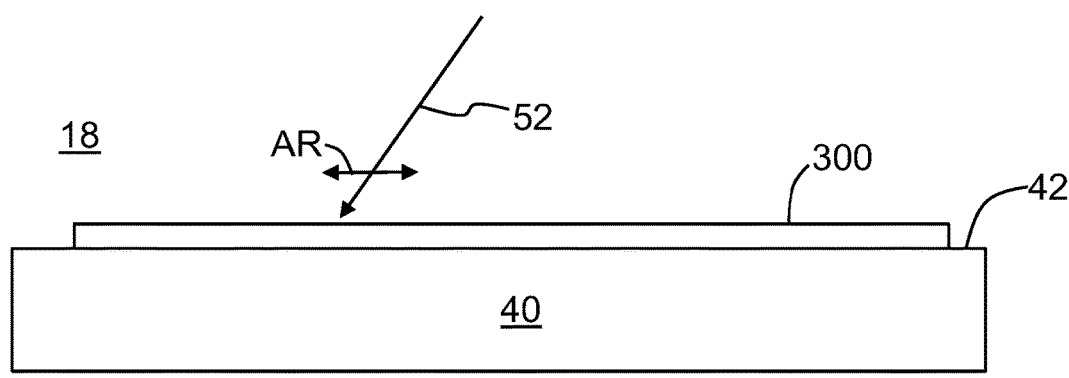

An optional fifth step, shown in FIG. 4C, includes a first laser annealing step wherein the laser beam 52 is scanned (e.g., raster scanned) over the $MO_x$ film 300 to raise the temperature of the $MO_x$ film 300 to be in the range from 500° C. to 1000° C. in an atmosphere of $H_2$ to reduce the $MoO_3$ to $MoO_2$. A purge step can be performed to remove excess $H_2$ and any other volatile byproducts.

Figure 4D:
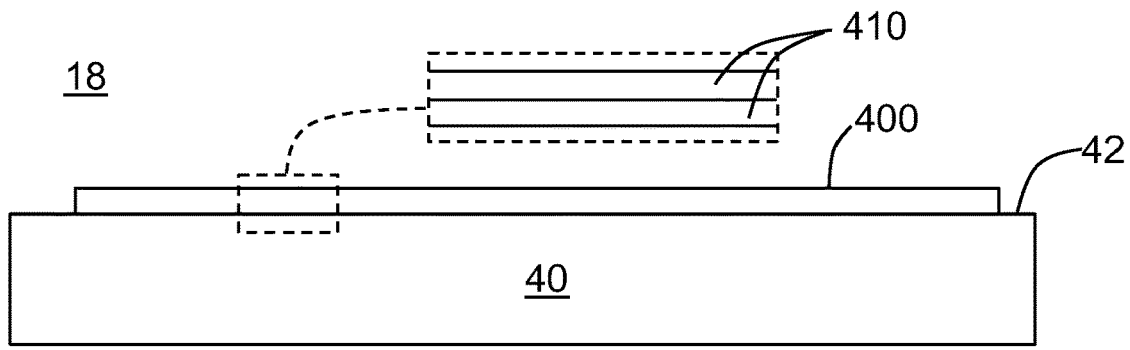

The sixth step involves introducing a third precursor gas 72 in the form of an X-bearing gas, e.g., a sulfur-bearing gas (e.g., $H_2S$, dimethyl disulfide, di-tert-butyl disulfide) to the transition section 26 to form an X-bearing plasma XP that includes radicalized precursor gas 72*. The radicalized precursor gas 72* can be provided in either pulsed or continuous manner and reacts with the $MoO_3$ film 300 (assuming the optional fifth step is not carried out) to form an amorphous film 400 having one or a few layers 410 of MX or $MX_2$ (e.g., between 1 and 5 layers or 1 and 3 layers), as shown in FIG. 4D.

Example reactions include:

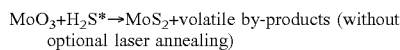

$MoO_3 + H_2S^* \rightarrow MoS_2 +$ volatile by-products (without optional laser annealing)

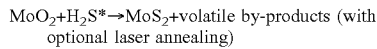

$MoO_2 + H_2S^* \rightarrow MoS_2 +$ volatile by-products (with optional laser annealing)

Figure 4E:
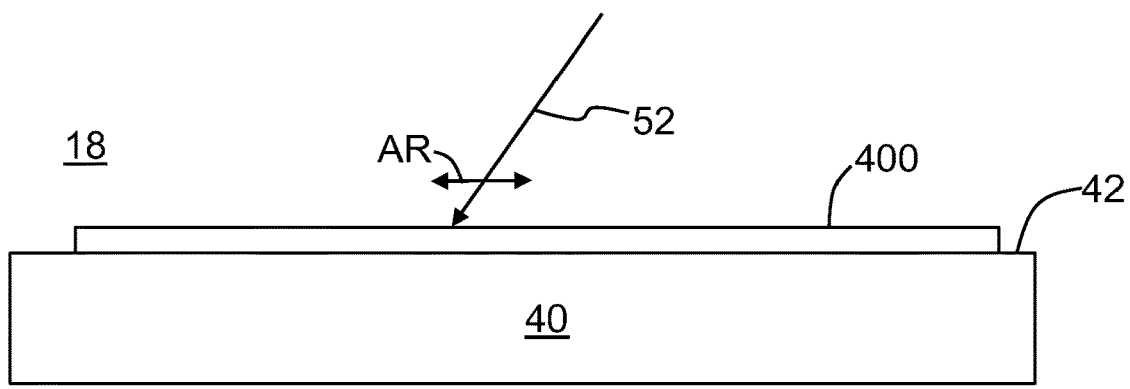
Figure 4F:
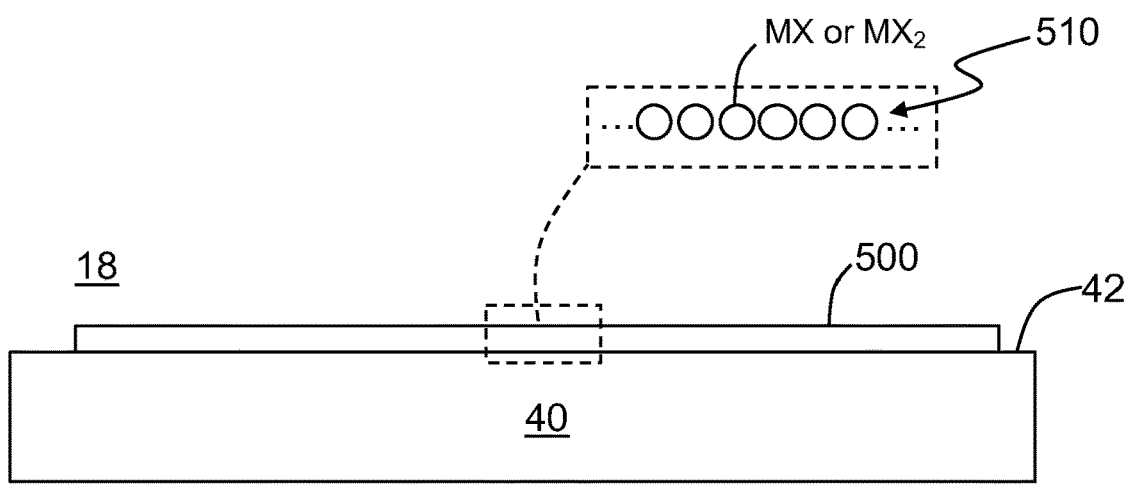

The seventh step, as shown in FIG. 4E, involves a second annealing step wherein the laser beam 52 is scanned (e.g., raster scanned) over the amorphous film 400 to achieve a temperature in the range between 650° C. and 1200° C., thereby forming a substantially crystalline film 500 made up of one or more layers 510 of MX or $MX_2$. The substantially crystalline film 500 is quasi-2D or substantially 2D, meaning that it includes one or a few layers 510, e.g., between 1 and 5 layers or between 1 and 3 layers.

Once the MX or $MX_2$ quasi-crystalline film 500 is formed, then the interior 18 is vented to the atmosphere using the inert gas 92, and the substrate 40 with the crystalline film 500 formed thereon is removed from the main chamber 16. As discussed above, the sixth and seventh steps can be performed in secondary ALD process chamber 114.

Once the substrate 40 is removed from the interior 18, then the substantially 2D and substantially MX or $MX_2$ crystalline film 500 is removed from the substrate 40 using conventional techniques such as the one described above in connection with the direct growth method.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of forming a substantially two-dimensional (2D) film of a metal chalcogenide on a surface of a substrate, the method comprising:
   a) adhering a layer of metal-bearing molecules having a metal M to the surface of a heated substrate using an atomic layer deposition (ALD) process;
   b) causing an oxidant precursor gas to react with the layer of metal-bearing molecules to form a layer of $MO_3$;
   c) repeating acts a) and b) to form an $MO_3$ film having multiple layers of $MO_3$;
   d) laser annealing the $MO_3$ film to form therefrom an $MO_2$ film;
   e) causing a chalcogenide-bearing radicalized precursor gas to react with the $MO_2$ film to form an amorphous and substantially 2D film of the metal chalcogenide; and
   f) laser annealing the amorphous and substantially 2D film to form therefrom a substantially crystalline and substantially 2D film of the metal chalcogenide, wherein the metal chalcogenide has the form MX or $MX_2$, where X is a chalcogenide.

2. The method according to claim 1, wherein the metal M is one of Mo and W and wherein the chalcogenide X is one of S, Se and Te.

3. The method according to claim 1, wherein act e) includes providing the chalcogenide-bearing radicalized precursor gas using a plasma.

4. The method according to claim 3, wherein the chalcogenide-bearing radicalized precursor gas comprises $H_2S^*$.

5. The method according to claim 1, further comprising processing the substrate to remove the substantially crystalline and substantially 2D film from the surface of the substrate.

6. The method according to claim 1, wherein the substantially crystalline and substantially 2D film of the metal chalcogenide has dimensions of 25 mm×25 mm or greater.

7. A method of forming a two-dimensional (2D) film of either a metal monochalcogenide (MX) or a metal dichalcogenide ($MX_2$) on a surface of a substrate using an atomic layer deposition process, the method comprising:
   a) providing the substrate in a chamber interior having a pressure in the range from 0.1 Torr to 0.5 Torr and heating the substrate to an initial temperature of between 150° C. and 500° C.;
   b) providing a metal-bearing precursor gas having a metal M to the chamber interior, including purging any excess metal-bearing precursor gas, wherein the metal M is one of Mo and W;
   c) providing an oxidant precursor gas into the chamber interior to form a layer of $MO_3$, and purging any excess oxidant gas;
   d) repeating acts b) and c) to form an $MO_3$ film having multiple layers of $MO_3$;
   e) laser annealing the $MO_3$ film to form an $MO_2$ film;
   f) introducing a chalcogenide precursor gas into the chamber interior using a plasma, wherein the chalcogenide precursor gas reacts with the $MO_2$ film to produce a film of amorphous MX or $MX_2$ where X is a chalcogenide, and purging the chamber interior; and g) scanning a laser beam over the amorphous film of MX or $MX_2$ to heat the amorphous film of MX or $MX_2$ to a temperature of between 650° C. and 1200° C. to produce a substantially crystalline film of either MX or $MX_2$.

8. The method according to claim 7, wherein the oxidant precursor gas is one of $H_2O$, $O_3$, O* and $O_2$.

9. The method according to claim 7, wherein the chalcogenide precursor gas includes sulfur.

10. The method according to claim 7, wherein the metal-bearing precursor gas is selected from the group of precursor gases consisting of:

Bis(tert-butylimido)bis(dimethylamido)Molybdenum, $MoCl_5$, Molybdenum hexacarbonyl, bis(tert-butylimido)bis(dimethylamido)Tungsten, $WH_2(iPrCp)_2$ and $WF_6$.

11. The method according to claim 7, wherein the laser beam has a nominal wavelength of 532 nm.

12. The method according to claim 7, wherein in act e), the providing of the chalcogenide precursor gas is performed in either a continuous manner or a pulsed manner.

13. The method according to claim 7, further comprising removing the substantially crystalline film of either MX or $MX_2$ from the surface of the substrate.

14. The method according to claim 7, wherein the laser scanning is performed in a raster scan.

15. The method according to claim 7, wherein the substrate is made of silicon or sapphire.

16. The method according to claim 7, wherein the substrate is supported by a heated chuck, and in act a), the substrate is heated to the initial temperature by the heated chuck.

17. The method according to claim 7, wherein the $MO_3$ film has between 3 and 8 layers of $MO_3$.

* * * * *